United States Patent
Cheng et al.

(10) Patent No.: US 10,114,291 B2
(45) Date of Patent: Oct. 30, 2018

(54) GRAFTING AGENT FOR FORMING SPACER LAYER

(71) Applicant: Taiwan Semiconductor Manufacturing Co., Ltd., Hsin-Chu (TW)

(72) Inventors: Ya-Ling Cheng, Yilan (TW); Ching-Yu Chang, Hsin-Chu (TW); Chien-Chih Chen, Taipei (TW); Chun-Kuang Chen, Guanxi Township (TW); Siao-Shan Wang, Tainan (TW); Wei-Liang Lin, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/061,364

(22) Filed: Mar. 4, 2016

(65) Prior Publication Data

US 2017/0256396 A1    Sep. 7, 2017

(51) Int. Cl.
| | |
|---|---|
| *H01L 21/31* | (2006.01) |
| *G03F 7/32* | (2006.01) |
| *H01L 21/02* | (2006.01) |
| *H01L 21/027* | (2006.01) |
| *H01L 21/308* | (2006.01) |
| *G03F 7/004* | (2006.01) |
| *G03F 7/40* | (2006.01) |
| *G03F 7/42* | (2006.01) |

(52) U.S. Cl.
CPC ............ *G03F 7/327* (2013.01); *G03F 7/0046* (2013.01); *G03F 7/322* (2013.01); *G03F 7/325* (2013.01); *G03F 7/40* (2013.01); *G03F 7/405* (2013.01); *G03F 7/425* (2013.01); *H01L 21/0273* (2013.01); *H01L 21/02118* (2013.01); *H01L 21/02282* (2013.01); *H01L 21/3086* (2013.01)

(58) Field of Classification Search
CPC ............................ G03F 7/405; H01L 21/0273
USPC .................................................. 430/316, 317
See application file for complete search history.

(56) References Cited

U.S. PATENT DOCUMENTS

| | | |
|---|---|---|
| 8,216,767 B2 | 7/2012 | Wang et al. |
| 8,323,870 B2 | 12/2012 | Lee et al. |
| 8,580,117 B2 | 11/2013 | Kao et al. |
| 8,658,344 B2 | 2/2014 | Wang et al. |
| 8,715,919 B2 | 5/2014 | Chang et al. |
| 8,741,551 B2 | 6/2014 | Wu et al. |
| 2012/0028195 A1* | 2/2012 | Wu .......................... G03F 7/405 430/323 |
| 2013/0323641 A1 | 12/2013 | Chang |
| 2014/0011133 A1 | 1/2014 | Liu et al. |
| 2014/0017615 A1 | 1/2014 | Chang |
| 2014/0017616 A1 | 1/2014 | Chang |
| 2014/0065843 A1 | 3/2014 | Chang et al. |
| 2014/0117563 A1 | 5/2014 | Yu et al. |
| 2014/0120459 A1 | 5/2014 | Liu et al. |
| 2014/0186773 A1 | 7/2014 | Chang |
| 2014/0234466 A1* | 8/2014 | Gao ...................... G03F 7/0002 425/385 |
| 2014/0255850 A1 | 9/2014 | Chang et al. |
| 2014/0272709 A1 | 9/2014 | Liu et al. |
| 2014/0272726 A1 | 9/2014 | Chang |
| 2014/0273521 A1 | 9/2014 | Wu et al. |
| 2015/0024597 A1* | 1/2015 | Gao .................... H01L 21/3086 438/694 |

* cited by examiner

*Primary Examiner* — Daborah Chacko-Davis
(74) *Attorney, Agent, or Firm* — Haynes and Boone, LLP

(57) ABSTRACT

A method includes forming a first layer over a substrate; forming a patterned photoresist layer over the first layer; applying a solution over the patterned photoresist layer to form a conformal layer over the pattern photoresist layer, wherein the conformal layer further includes a first portion over a top surface of the patterned photoresist layer and second portion extending along sidewalls of the patterned photoresist layer; selectively removing the first portion of the conformal layer formed over the top surface of the patterned photoresist layer; and selectively removing the patterned photoresist layer thereby leaving the second portion of the conformal layer.

20 Claims, 19 Drawing Sheets

GRAFTING AGENT FOR FORMING SPACER LAYER

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. Although existing IC devices and methods of fabricating IC devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
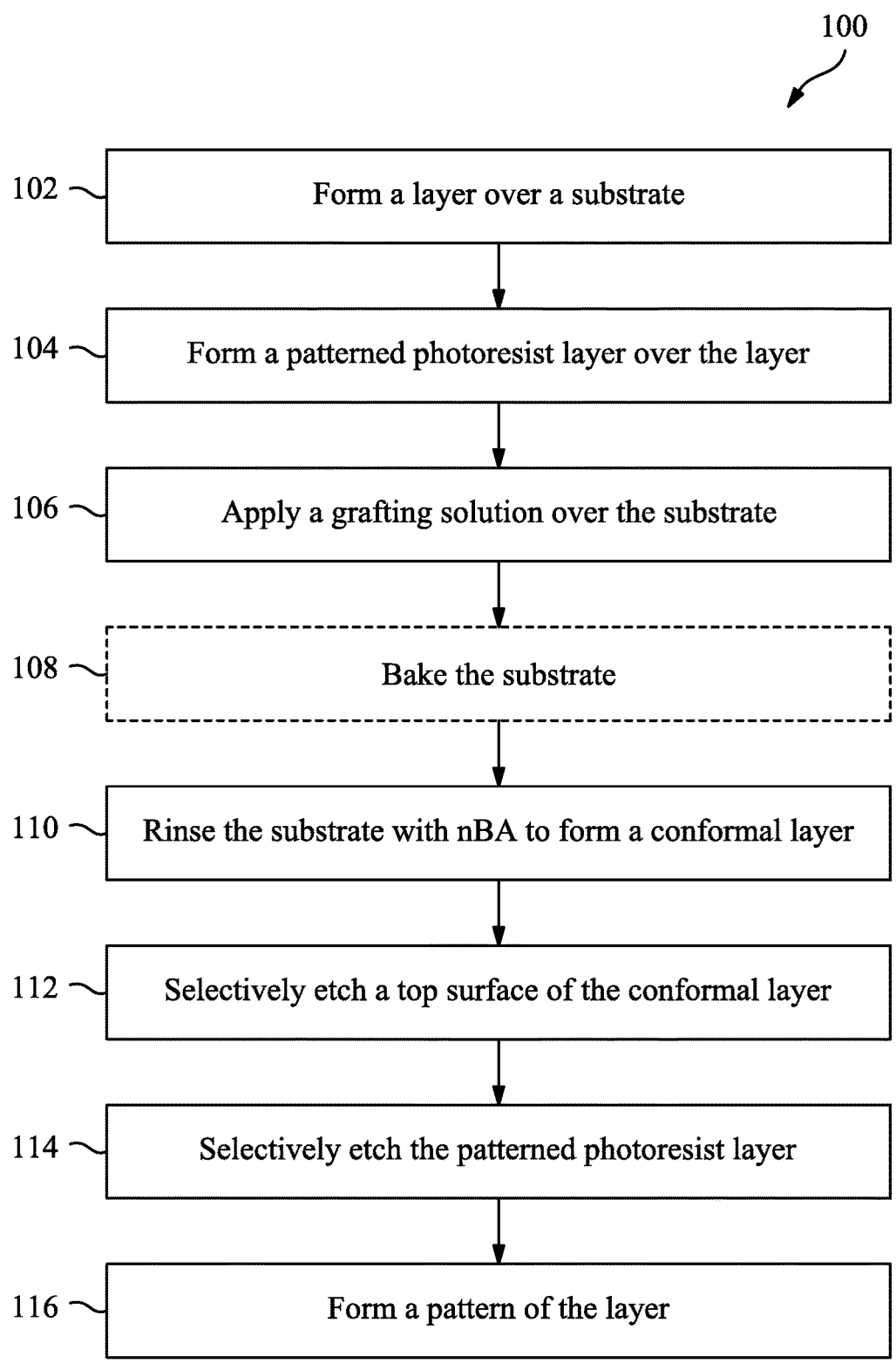
FIG. 1 is a flowchart illustrating a method of fabricating a semiconductor device in accordance with, some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the semiconductor device sizes continue to shrink, for example below 20 nanometer (nm) nodes, traditional lithography technologies have optical restrictions, which leads to resolution issues and may not achieve the desired lithography performance. In comparison, extreme ultraviolet (EUV) lithography can achieve much smaller device sizes. Moreover, forming a spacer layer under such smaller device sizes may further help to achieve even smaller device sizes and provide other advantages. However, while existing, spacer layers have been generally adequate for their intended purposes, they have not been entirely satisfactory in every aspect. Thus, the present disclosure describes devices and methods designed to improve the formation of spacer layers under smaller device sizes.

FIG. 1 is a flow chart of a method 100 of forming a pattern on a substrate (e.g., a semiconductor wafer) according to various aspects of the present disclosure. The method 100 may be implemented, in whole or in part, by a system employing deep ultraviolet (DUV) lithography, extreme ultraviolet (EUV) lithography, electron beam (e-beam) lithography, x-ray lithography, and/or other lithography processes to improve pattern dimension accuracy. In the present embodiment, EUV and/or e-beam lithography is used as the primary example. Additional operations can be provided before, during, and after the method 100, and some operations described can be replaced, eliminated, or moved around for additional embodiments of the method.

The method 100 is described below in conjunction with FIGS. 2A, 2B, 2C, 2D, 2E, 2F, 2G wherein a semiconductor device 200 is fabricated by using embodiments of the method 100. The semiconductor device 200 may be an intermediate device fabricated during processing of an IC, or a portion thereof, that may comprise SRAM and/or other logic circuits, passive components such as resistors, capacitors, and inductors, and active components such as p-type FETs (PFETs), n-type FETs (NFETs), fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and/or combinations thereof.

Figure 2A:
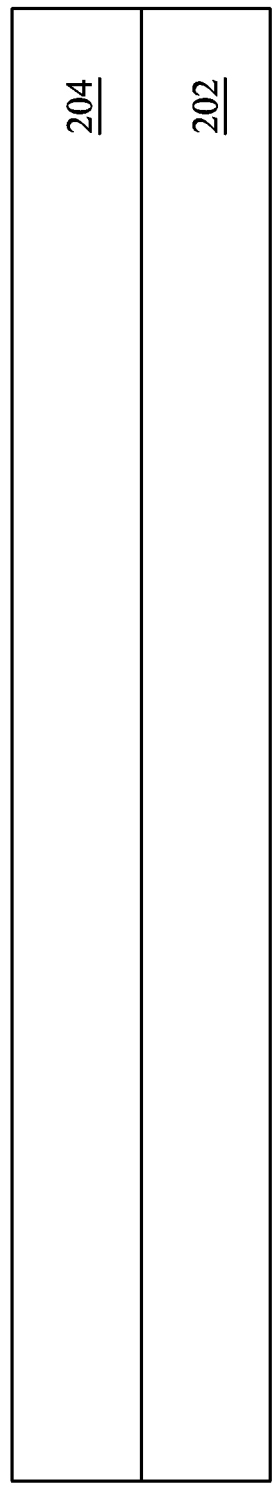
FIGS. 2A, 2B, 2C, 2D, 2E, 2F, and 2G are diagrammatic cross-sectional side views of a semiconductor device at various stages of fabrication in accordance with some embodiments of the present disclosure.

Referring now to FIG. 1 in conjunction with FIG. 2A, the method 100 begins with operation 102 in which a substrate 202 overlaid by a layer 204 of a semiconductor device 200 is provided. The semiconductor device 200 is a semiconductor wafer in the present embodiment. The semiconductor device 200 includes a semiconductor substrate 202, such as a silicon substrate in some embodiments. The substrate 202 may include another elementary semiconductor, such as germanium, or diamond in some embodiments. The substrate 202 may include a compound semiconductor, such as silicon carbide, gallium arsenic, indium arsenide, and indium phosphide. The substrate 202 may include an alloy semiconductor, such as silicon germanium, silicon germanium carbide, gallium arsenic phosphide, and gallium indium phosphide. The substrate 202 may include one or more epitaxial semiconductor layer, such as semiconductor layer(s) epitaxially grown on a silicon substrate. For example, the substrate may have an epitaxial layer overlying a bulk semiconductor. Further, the substrate may be strained for performance enhancement. For example, the epitaxial layer may include semiconductor materials different from those of the bulk semiconductor such as a layer of silicon germanium overlying a bulk silicon, or a layer of silicon overlying a bulk silicon germanium formed by a process including selective epitaxial growth (SEG). Furthermore, the substrate 202 may include a semiconductor-on-insulator (SOI) structure. For examples, the substrate may include a buried oxide (BOX) layer formed by a process such as separation by implanted oxygen (SIMOX). In other embodiments, the substrate 202 may include a glass such as in thin film transistor (TFT) technologies. Regarding the layer 204, in accordance with various illustrative embodiments, the layer 204 may include a single layer (as illustrated) that is formed of a material (e.g., a dielectric material) that is suitable to form a patterned mask over the substrate 202 and such a patterned mask may be further used to transfer a pattern to the substrate 202. In some examples, any of a variety of materials, including but not limited to another semiconductor substrate (similar to or different from the substrate 202), a silicon-based material, a metal-containing material, a silicon-metal-containing material, an organic polymer material, and/or an inorganic polymer material, may be included in the layer 204. Alternatively or additionally, although the illustrated embodiment of FIG. 2A shows that the layer 204 is a single layer, the layer 204 may include multiple layers (not shown). For example, the layer 204 may further include an under layer, a middle layer (a hardmask layer), etc.

Figure 2B:
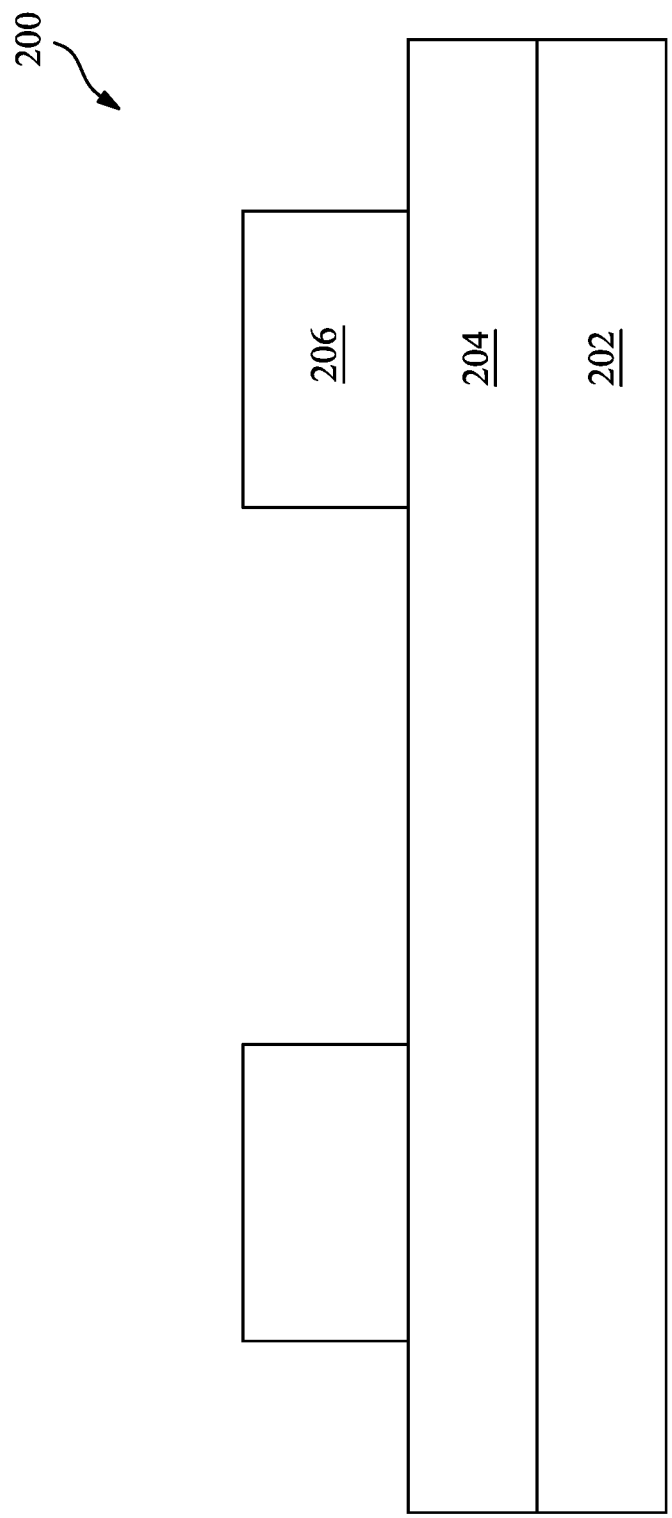

Referring to FIG. 2B, the method 100 proceeds to operation 104 with forming a patterned photoresist layer 206 over the layer 204. In some specific embodiments, the patterned photoresist layer 206 includes a negative tone developer photoresist, and more specifically, the patterned photoresist layer 206 may be already developed by a negative tone developer. Thus, the forming the patterned photoresist layer 206 may include at least one or more following processes: forming a negative tone developer photoresist layer over the layer 204, exposing the negative tone developer photoresist layer, and developing the exposed negative tone developer photoresist layer by negative tone developer such as nBA. Although the current embodiment implements the patterned photoresist layer 206 includes a negative tone developer photoresist, in some alternative embodiments, the patterned photoresist layer 206 may include a positive tone photoresist (i.e., the patterned photoresist layer 206 is developed by a positive tone developer such as TMAH).

Figure 2C:
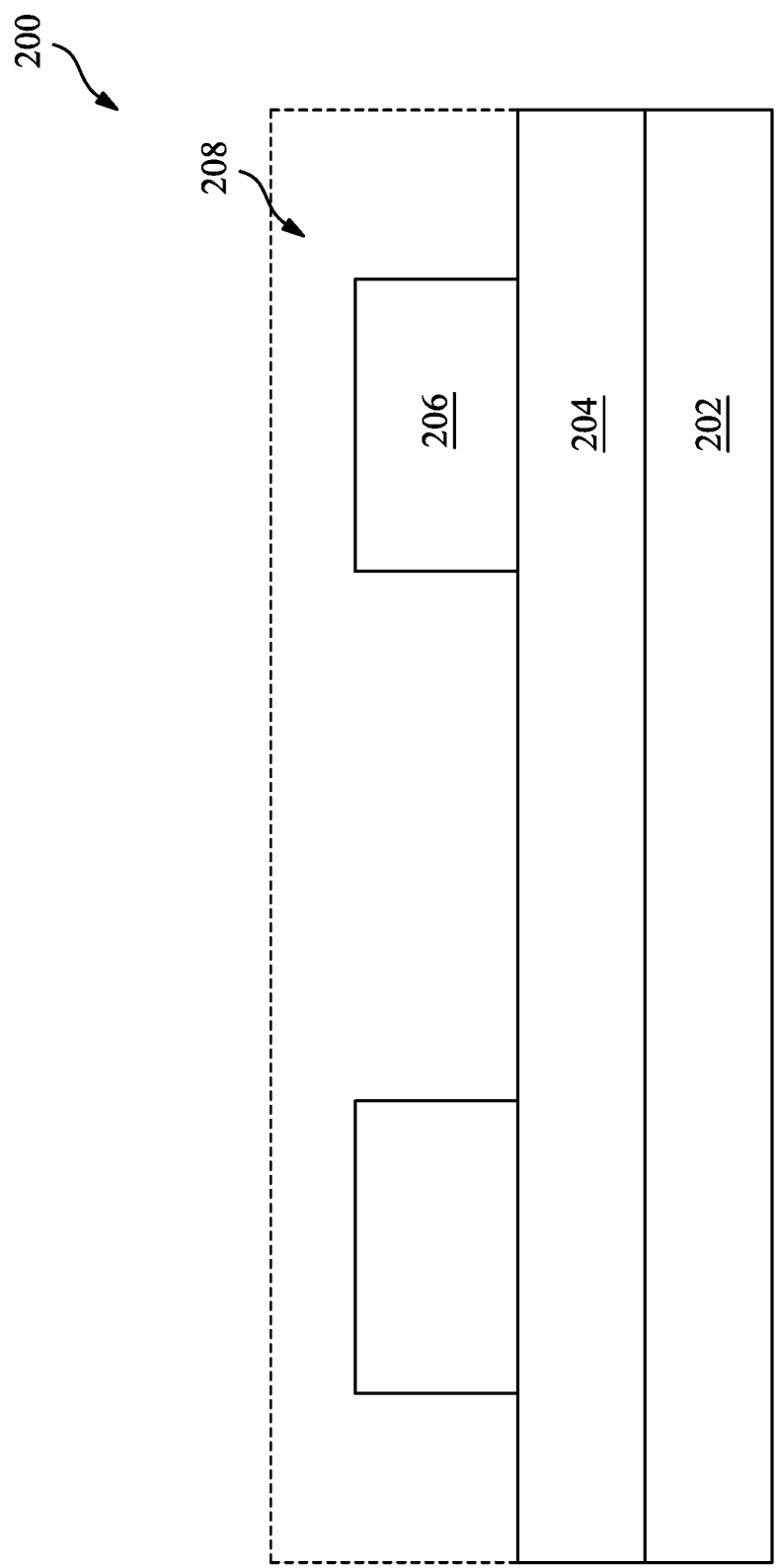

Referring now to FIG. 1 and FIG. 2C, the method 100 proceeds to operation 106 in which a grafting solution 208 is applied over the substrate. Such a grafting solution 208 is configured to form a spacer layer only over the patterned photoresist layer 206 and such a spacer layer is further processed to form a pattern (e.g., a finer pattern). Conventionally, forming, a spacer layer over a patterned layer (e.g., a patterned photoresist layer) generally requires a high-temperature baking step and such formed spacer layer overlays not only the patterned layer but also an underlaying layer (e.g., a substrate). Thus, the spacer layer formed by conventional approach involves a removal step (e.g., etching step) to remove the spacer layer formed over the underlaying layer but also increases the risk from damage being caused by a subsequent high-temperature baking step.

As will be discussed below, the present disclosure provides various embodiments of a grafting solution to form a spacer layer only over a patterned layer. The disclosed processes allow the spacer formation to occur at room temperature and without the conventional etching processes. As such, by using the disclosed grafting solution, a variety of undesirable damages caused by the above-mentioned high-temperature baking step and/or additional etching step(s) may be advantageously avoided. In some embodiments, the grafting solution is fluid-based and the fluid-based grafting solution further includes a grafting agent, an additive, and a solvent. More specifically, the additive may include a surfactant (surface active agent), for example, an anionic surfactant, a cationic surfactant, a nonionic surfactant, and/or a zwitterionic surfactant; the solvent may include an organic solvent, for example, Methyl n-Amyl Ketone (MAK), nBA, gamma-Butyrolactone (GBL), Propylene Glycol Monomethyl Ether Acetate (PGMEA), Propylene Glycol Monomethyl Ether (PGME), Cyclohexanine, and/or Methyl Isobutyl Carbinol (MIBC); and the grafting agent may include one or more polymers to "graft" a spacer layer over the patterned photoresist layer, which will be discussed later. Referring back to FIG. 1, in some embodiments, the method 100 may optionally include operation 108 in which the substrate is baked in a relatively lower elevated temperature (e.g., ranging between about 60° C. to about 170° C. for about 10 seconds to about 180 seconds).

Figure 2D:
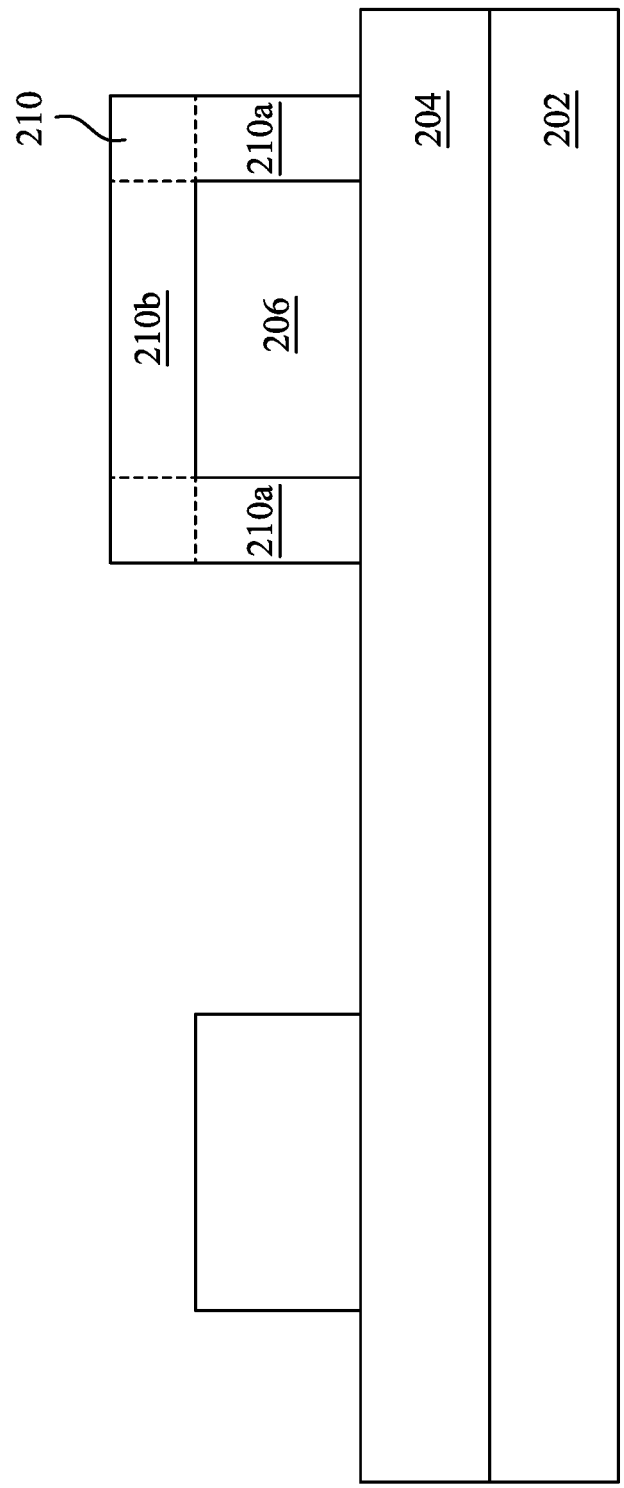

Referring still to FIG. 1 in associated with FIG. 2D, the method 100 continues to operation 110 with rinsing the substrate with n-butyl acetate (nBA) so as to form a conformal layer 210 (e.g., a spacer layer) over the patterned photoresist layer 206 only. As illustrated, the conformal layer 210 includes a first portion 210a that extends along sidewalls of the patterned photoresist layer 206 and a second portion 210b that overlays a top surface of the patterned photoresist layer 206. In some embodiments, the conformal layer 210 may have a thickness that ranges between about 5 nm to about 30 nm. As will be discussed below, the conformal layer 210 may be a silicon-containing polymer layer while any of a variety of polymer layer may be used to form the conformal layer 210 while remaining within the scope of the present disclosure. Although in the current illustrated embodiment, the conformal layer 210 is formed after rinsing the substrate with solvent, which may include nBA, MAK, PGMEA, PGEM, or hybrid solvent of above (i.e., the operation 110 with respect to FIG. 1), the conformal layer 210 may be formed readily over the patterned photoresist layer after applying the grafting solution over the substrate or after the optional baking step. That is, in some embodiments, the conformal layer 210 is formed by operation 106 or by operation 108.

Figure 2E:
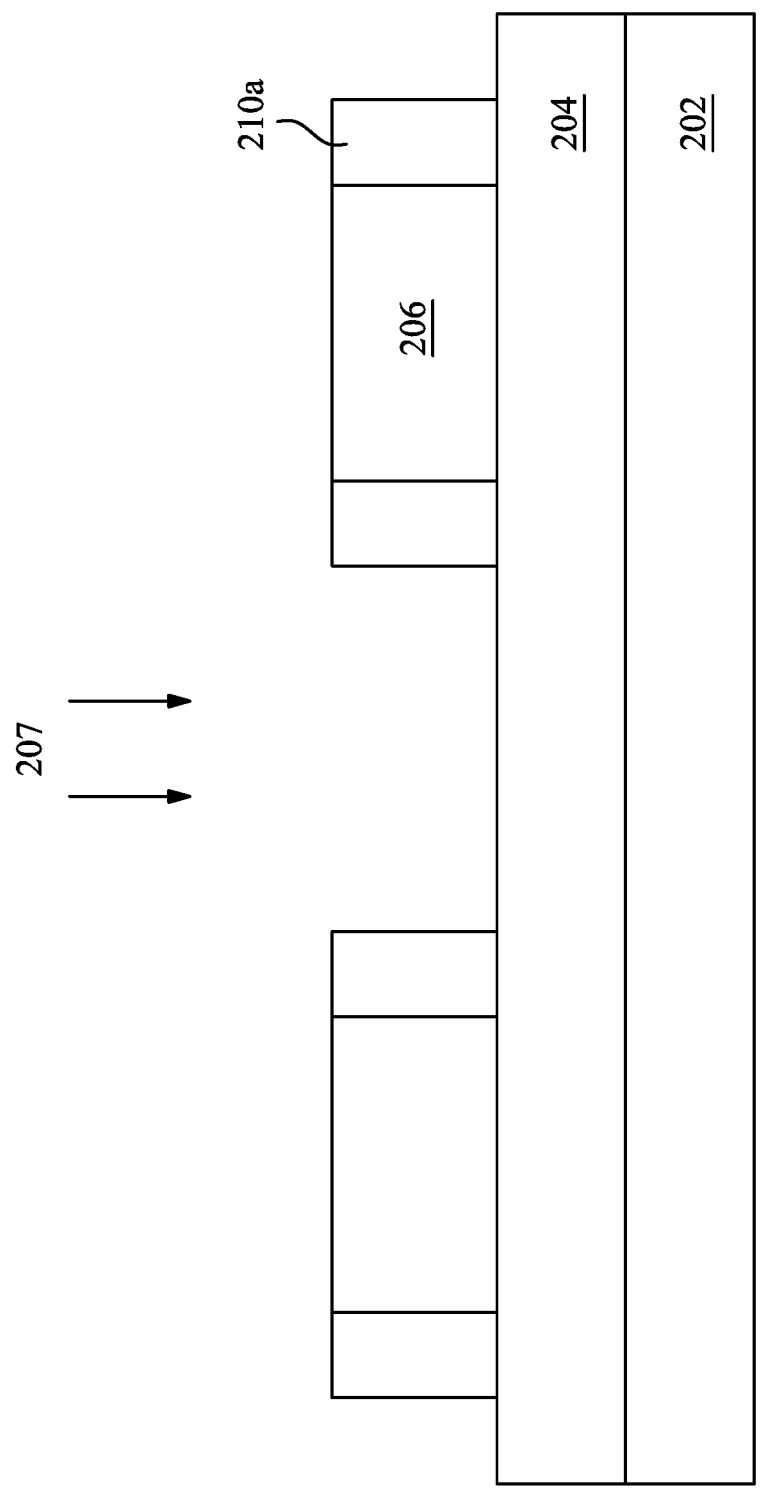

Referring now to FIG. 1 and FIG. 2E, the method 100 continues to operation 112 with selectively etching the second portion of the conformal layer 210b. In some embodiments, the selectively etching of the second portion 210b may include a dry etching process 207 such as a reactive ion etching (RIE) process such that only the second portion 210b is etched and the first portion 210a remains intact during/after the selectively etching process 207.

Figure 2F:
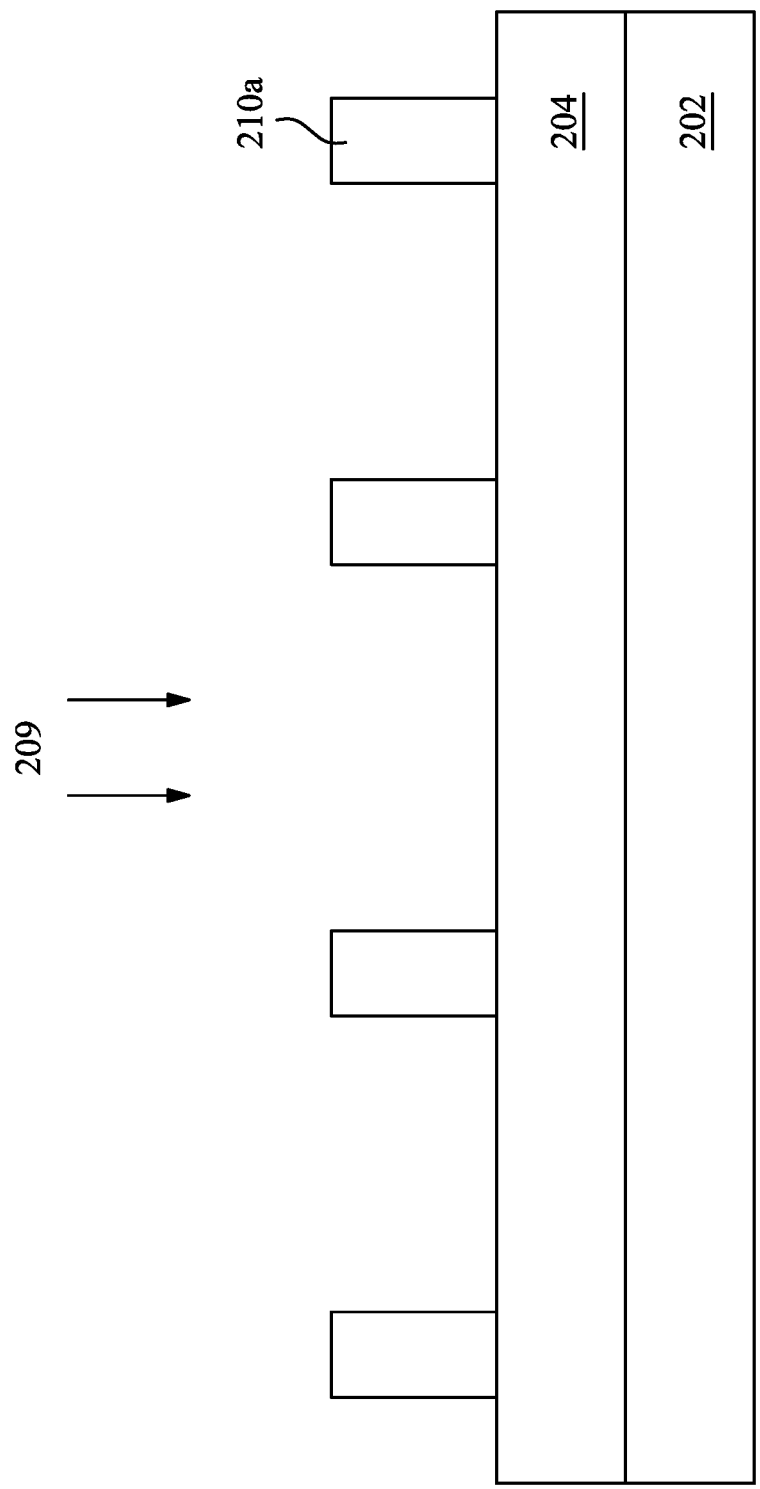

Referring now to FIG. 1 and FIG. 2F, after the second portion of the conformal layer 210b is removed (etched), the method 100 continues to operation 114 with selectively etching the patterned photoresist layer 206 by an etching process 209. In accordance with some illustrative embodiments, the process 209 may include a dry etching process (e.g., RIE) and/or a wet etching process. In the example of implementing the process 209 as a wet etching process, tetramethylammonium hydroxide (TMAH) may be used to selectively etch the patterned photoresist layer 206 while keeping the first portion of the conformal layer 210a intact.

Figure 2G:
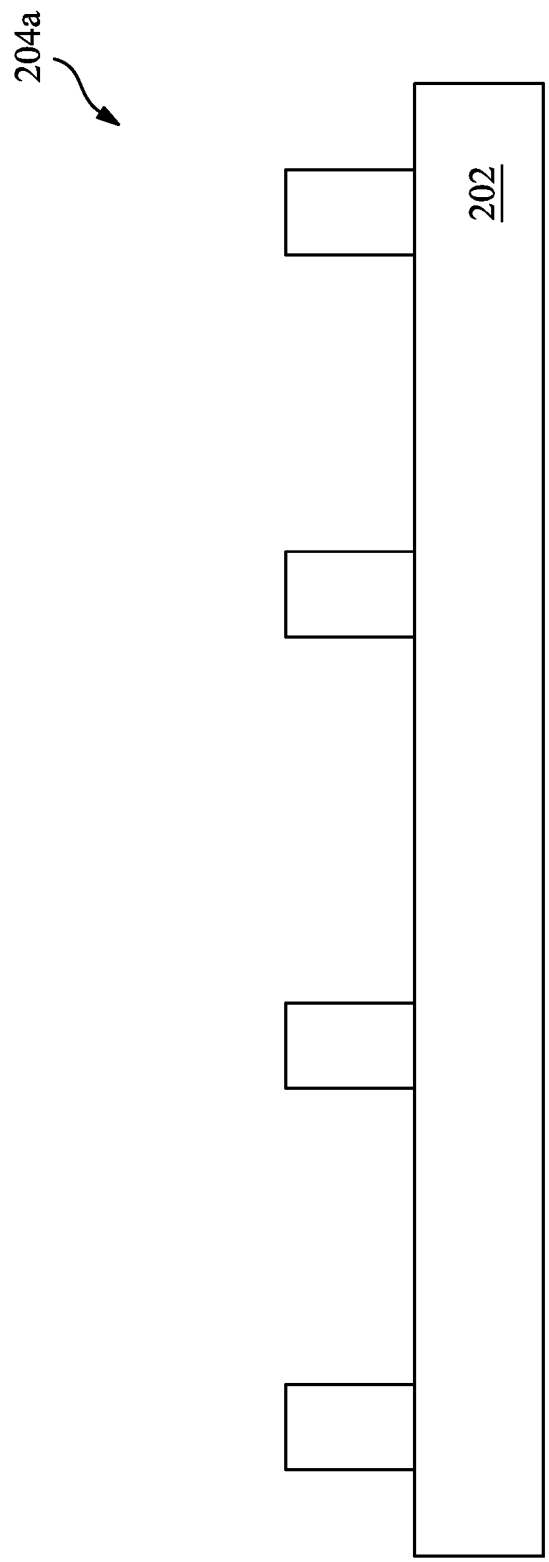

Referring now to FIG. 1 and FIG. 2G, the method 100 proceeds to operation 116 with forming a pattern 204a of the layer 204 by using the first portion of the conformal layer 210a as a mask. The formation of the pattern 204a may include at least one process such as a dry etching process. In the example of the layer 204 is a semiconductor layer (a silicon germanium layer) over the substrate 202, the pattern 204a of the silicon germanium layer may be designed as a fin structure of a subsequently formed FinFET (Fin Field Effect Transistor) structure. Alternatively, the formed pattern 204a may be subsequently used as another mask to transfer the pattern 204a to the substrate 202 by using at least one etching process.

Figure 3:
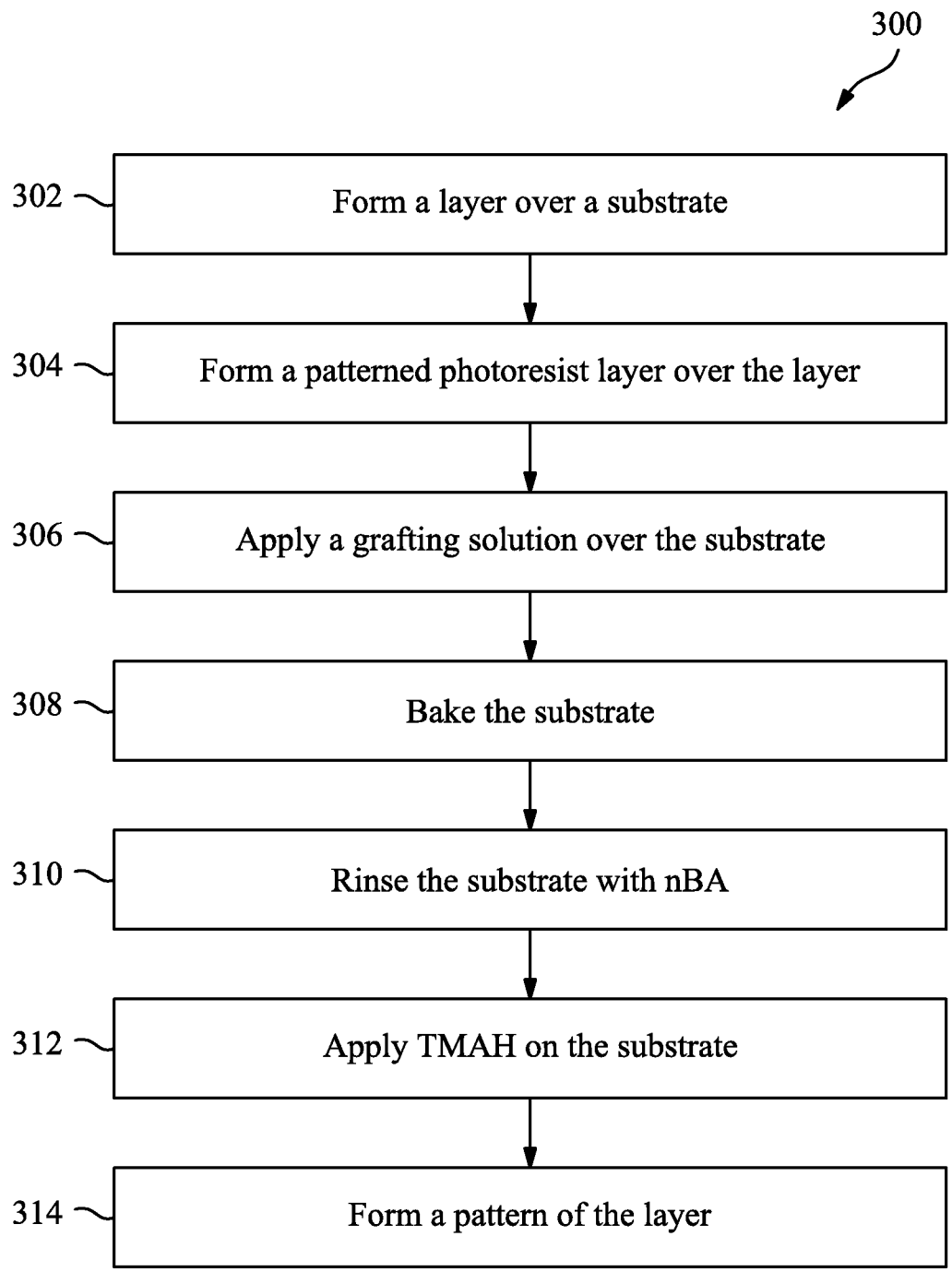
FIG. 3 is a flowchart illustrating a method of fabricating a semiconductor device in accordance with some embodiments of the present disclosure.

FIG. 3 is another flow chart of a method 300 of forming a pattern on a substrate (e.g., a semiconductor wafer) according to various aspects of the present disclosure. The method 300 may be implemented, in whole or in part, by a system employing deep ultraviolet (DUV) lithography, extreme ultraviolet (EUV) lithography, electron beam (e-beam) lithography, x-ray lithography, and/or other lithography processes to improve pattern dimension accuracy. In the present embodiment, EUV and/or e-beam lithography is used as the primary example. Additional operations can be provided before, during, and after the method 300, and some operations described can be replaced, eliminated, or moved around for additional embodiments of the method.

The method 300 is described below in conjunction with FIGS. 4A, 4B, 4C, 4D, 4E, 4F, 4G, and 4H wherein a semiconductor device 400 is fabricated by using embodiments of the method 300. The semiconductor device 400 may be an intermediate device fabricated during processing of an IC, or a portion thereof, that may comprise SRAM and/or other logic circuits, passive components such as resistors, capacitors, and inductors, and active components such as p-type FETs (PFETs), n-type FETs (NFETs), fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and/or combinations thereof.

Figure 4A:
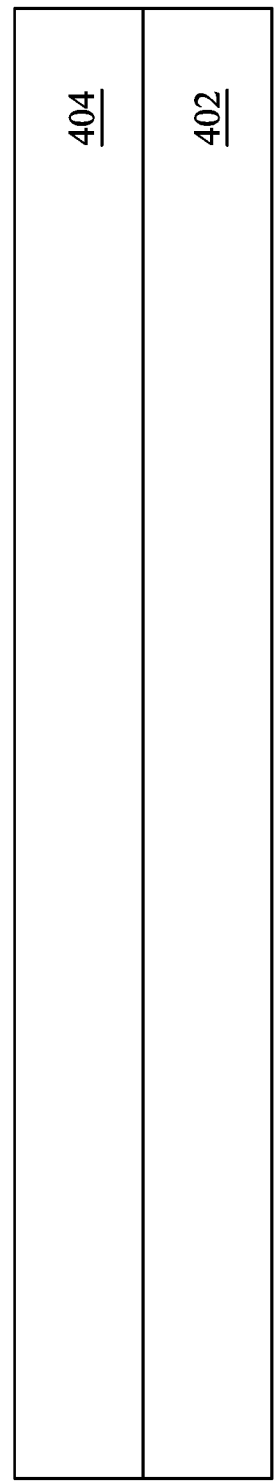
FIGS. 4A, 4B, 4C, 4D, 4E, 4F, 4G, and 4H are diagrammatic cross-sectional side views of a semiconductor device at various stages of fabrication in accordance with some embodiments of the present disclosure.

Referring now to FIG. 3 in conjunction with FIG. 4A, the method 300 begins with operation 302 in which a substrate 402 overlaid by a layer 404 of a semiconductor device 400 is provided. The semiconductor device 400 is a semiconductor wafer in the present embodiment. The semiconductor device 400 includes a semiconductor substrate 402, such as a silicon substrate in some embodiments. The substrate 402 may include another elementary semiconductor, such as germanium, or diamond in some embodiments. The substrate 402 may include a compound semiconductor, such as silicon carbide, gallium arsenic, indium arsenide, and indium phosphide. The substrate 402 may include an alloy semiconductor, such as silicon germanium, silicon germanium carbide, gallium arsenic phosphide, and gallium indium phosphide. The substrate 402 may include one or more epitaxial semiconductor layer, such as semiconductor layer(s) epitaxially grown on a silicon substrate. For example, the substrate may have an epitaxial layer overlying a bulk semiconductor. Further, the substrate may be strained for performance enhancement. For example, the epitaxial layer may include semiconductor materials different from those of the bulk semiconductor such as a layer of silicon germanium overlying a bulk silicon, or a layer of silicon overlying a bulk silicon germanium formed by a process including selective epitaxial growth (SEG). Furthermore, the substrate 402 may include a semiconductor-on-insulator (SOI) structure. For examples, the substrate may include a buried oxide (BOX) layer formed by a process such as separation by implanted oxygen (SIMOX). In other embodiments, the substrate 402 may include a glass such as in thin film transistor (TFT) technologies. Regarding the layer 404, in accordance with various illustrative embodiments, the layer 404 may include a single layer (as illustrated) that is formed of a material (e.g., a dielectric material) that is suitable to form a patterned mask over the substrate 402 and such a patterned mask may be further used to transfer a pattern to the substrate 402. In some examples, any of a variety of materials, including but not limited to another semiconductor substrate (similar to or different from the substrate 402), a silicon-based material, a metal-containing material, a silicon-metal-containing material, an organic polymer material, and/or an inorganic polymer material, may be included in the layer 404. Alternatively or additionally, although the illustrated embodiment of FIG. 4A shows that the layer 404 is a single layer, the layer 404 may include multiple layers (not shown). For example, the layer 404 may further include an under layer, a middle layer (a hardmask layer), etc.

Figure 4B:
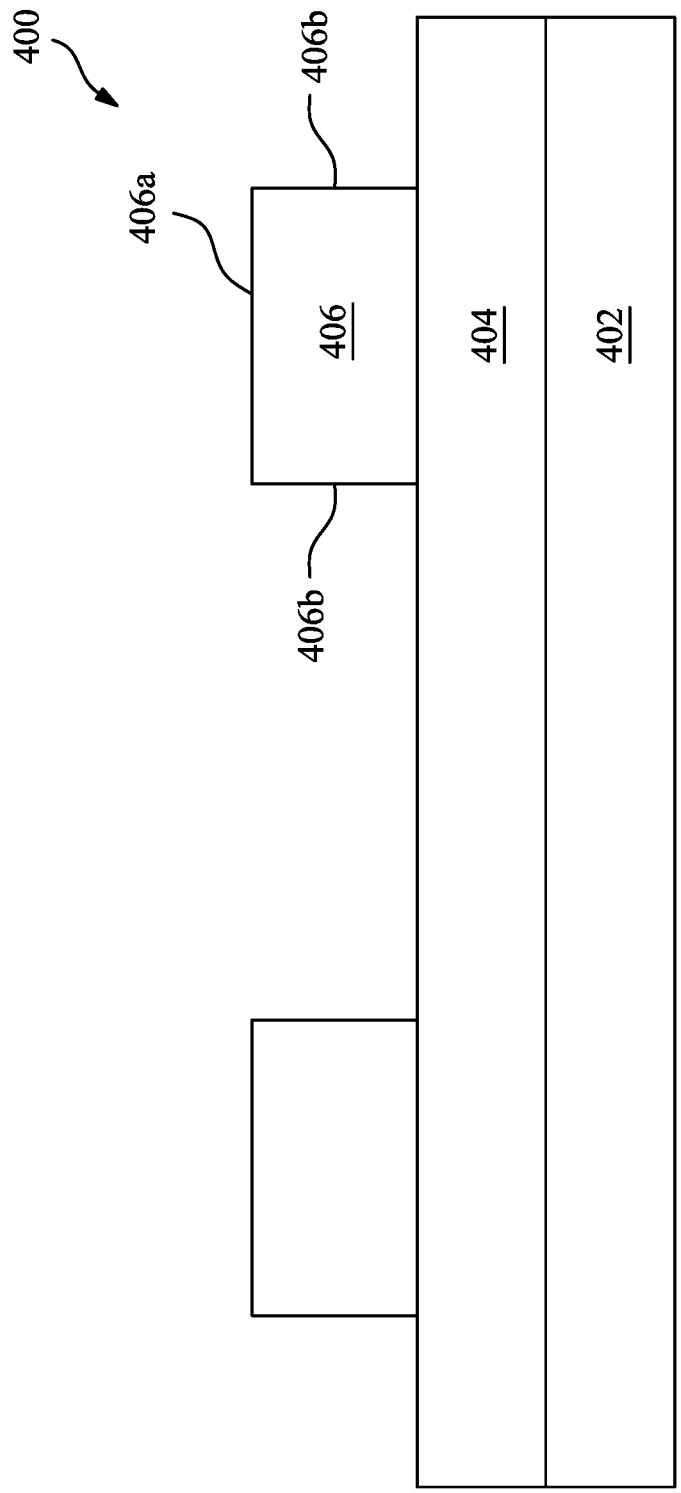

Referring to FIG. 3 in association with FIG. 4B, the method 300 proceeds to operation 304 with forming a patterned photoresist layer 406 over the layer 404. In some specific embodiments, the patterned photoresist layer 406 includes a negative tone developer photoresist, and more specifically, the patterned photoresist layer 406 may be already developed by a negative tone developer. Thus, the forming the patterned photoresist layer 406 may include at least one or more following processes: forming a negative tone developer photoresist layer over the layer 404, exposing the negative tone developer photoresist layer, and developing the exposed negative tone developer photoresist layer by negative tone developer such as nBA. Although the current embodiment implements the patterned photoresist layer 406 includes a negative tone photoresist, in some alternative embodiments, the patterned photoresist layer 406 may include a positive tone photoresist (i.e., the patterned photoresist layer 406 is developed by a positive tone developer such as TMAH).

Referring still to FIG. 4B, the formed patterned photoresist layer 406 may further include an additive that includes a floating control unit/component. The floating control unit is configured to cause the additive to float (i.e., rise up) toward a top surface 406a of the photoresist layer 406, particularly as the photoresist layer 406 undergoes a spin-drying process or a baking process. In some specific embodiments, the floating control, unit contains fluorine and/or a fluorine derivative, for example a C1-C9 fluorine-containing alkyl group. Fluorine reduces surface energy, thereby facilitating the floating of the additive (toward the top surface 406a) within the photoresist layer 406. In some embodiments, the ratio (or concentration) of fluorine or fluorine derivative is between about 10% and about 80% in the additive. In other words, about 10%-80% of the additive is the fluorine or the fluorine derivative. Such an uneven distribution of the floating control unit may in turn change a respective surface characteristic of the top surface 406a of the photoresist layer 406 and sidewall 406b of the photoresist layer 406, which results in a layer formed over the photoresist layer 406 (e.g., a spacer layer 410) that includes at least two different characteristics on a portion of the spacer layer 410 formed over the top surface of the photoresist layer 406 and another portion of the spacer layer 410 formed along sidewall(s) of the photoresist layer 406. Details of the spacer layer 410 will be discussed below.

Figure 4C:
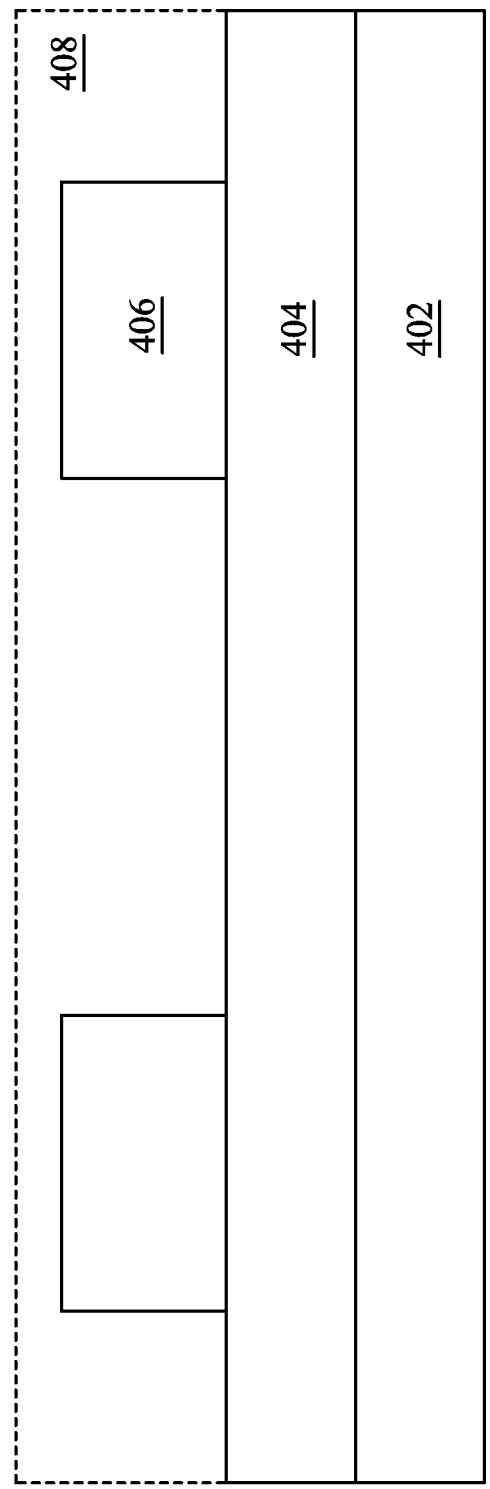
Figure 4D:
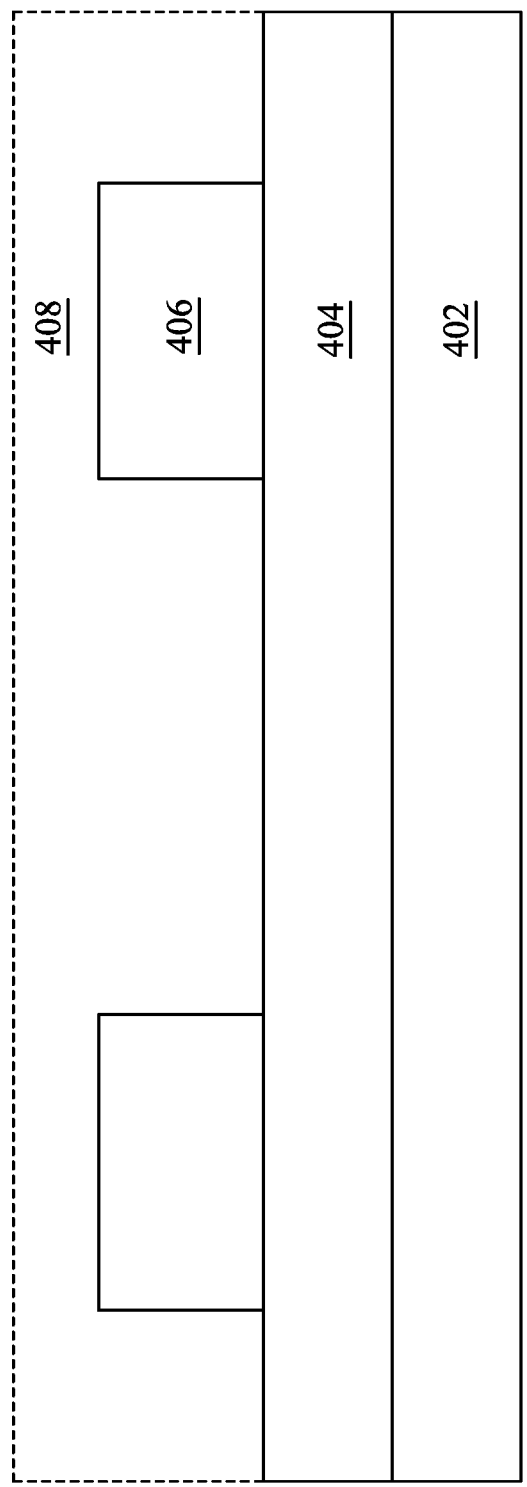

Referring back to FIG. 3 and in association with FIG. 4C, the method 300 proceeds to operation 306 in which a grafting solution 408 is applied over the substrate. Such a grafting solution 408 is configured to form a spacer layer only over the patterned photoresist layer 406. In some embodiments, the grafting solution is fluid-based and the fluid-based grafting solution further includes a grafting agent, an additive, and a solvent. More specifically, the additive may include a surfactant (surface active agent), for example, an anionic surfactant, a cationic surfactant, a nonionic surfactant, and/or a zwitterionic surfactant; the solvent may include an organic solvent, for example, Methyl n-Amyl Ketone (MAK), n-Butyl Acetate (nBA), gamma-Butyrolactone (GBL), Propylene glycol methyl ether acetate (PGMEA), Propylene Glycol Methyl Ether (PGME), Cyclohexanine, and/or Methyl Isobutyl Carbinol (MIBC); and the grafting agent may include one or more polymers to "graft" a spacer layer over the patterned photoresist layer, which will be discussed later.

Figure 4E:
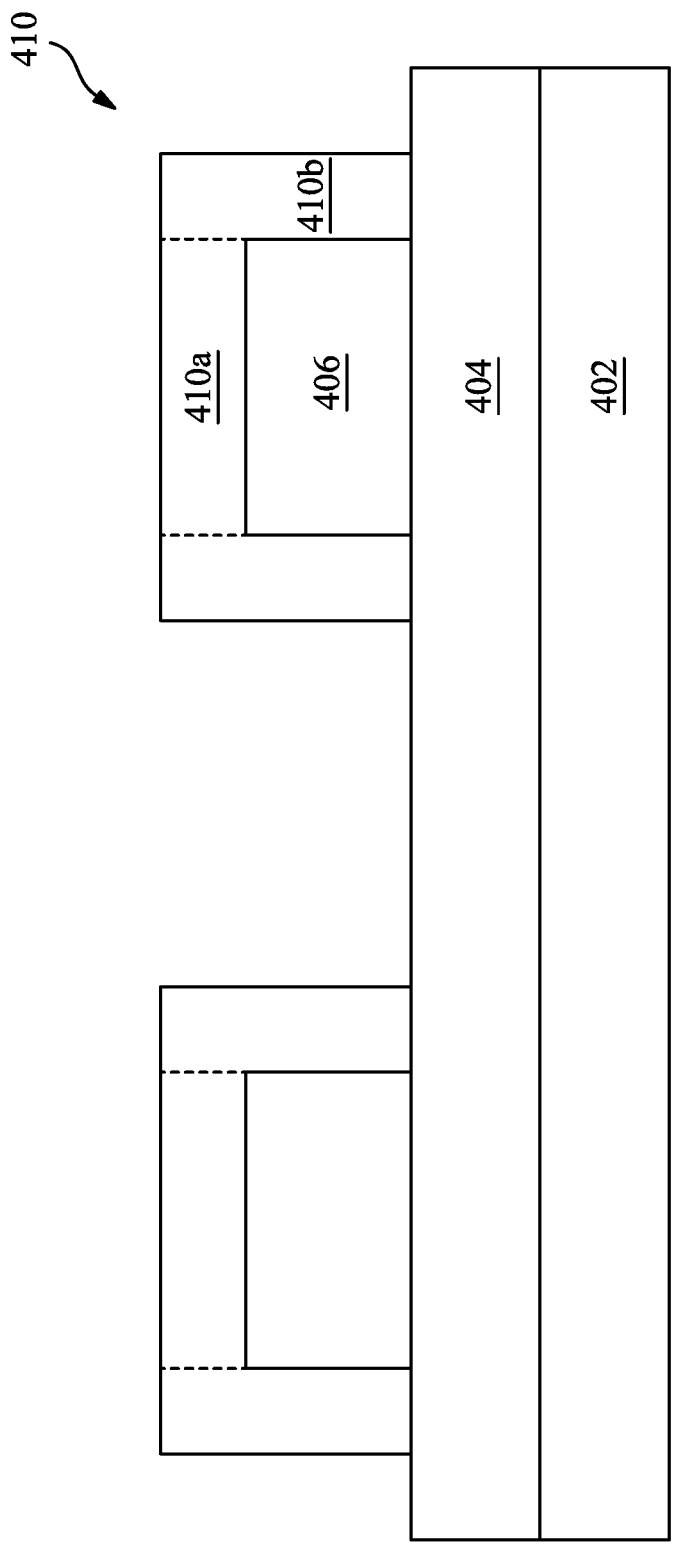

Referring still to FIG. 3, in some embodiments, the method 300 may proceed to operation 308 in which the substrate is baked at a temperature ranging between about 60° C. to about 170° C. for about 10 seconds to about 180 seconds. Operation 310 follows with rinsing the substrate with solvent, which may include nBA, MAK, PGMEA, PGEM, and/or a combination thereof. In some embodiments, after the rinsing the substrate with solvent, which may include nBA, MAK, PGMEA, POEM, and/or a combination thereof the spacer layer 410 is formed only over the patterned photoresist layer 406, as illustrated in FIG. 4E. In the illustrated embodiment of FIG. 4E, the spacer layer 410 includes a first portion 410a that overlays the top surface of the patterned photoresist layer 406 and a second portion 410b that extends along sidewalls of the patterned photoresist layer 406. As described above, due to the different surface characteristics on the top surface 406a and the sidewall(s) 406b of the photoresist layer 406, the first portion 410a may have a characteristic different than the second portion 410b such as, for example, a porosity. In an example, the first portion 410a may be more porous than the second portion 410b. Thus, the spacer layer 410 may be referred to as a "heterogeneous" spacer layer.

As will be discussed below, in general, the spacer layer 410 may be a silicon-containing polymer layer while any of a variety of polymer layer may be used to form the spacer layer 410 while remaining within the scope of the present disclosure. Although in the current illustrated embodiment, the spacer layer 410 is formed after rinsing the substrate with nBA (i.e., the operation 310 with respect to FIG. 3), the spacer layer 410 may be formed readily over the patterned photoresist layer after applying the grafting solution over the substrate or after the optional baking step. That is, in some embodiments, the spacer layer 410 is formed by operation 306 or by operation 308.

Figure 4F:
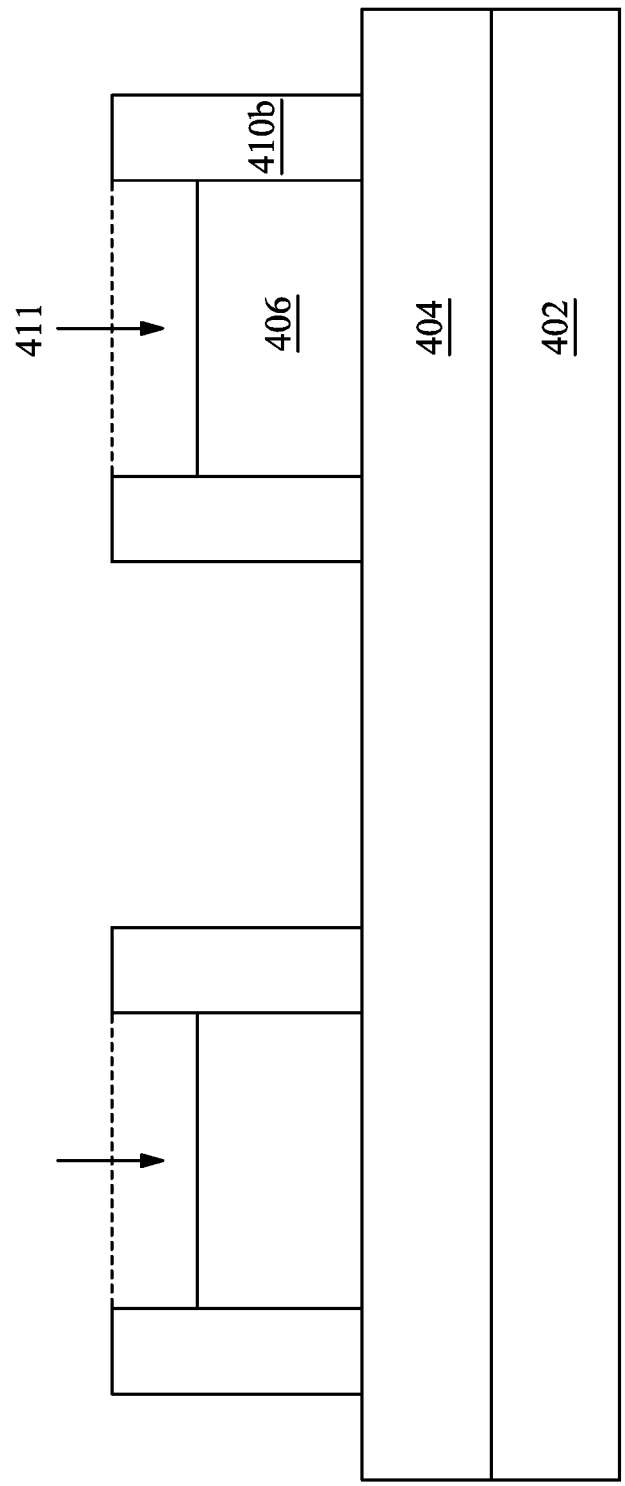
Figure 4G:
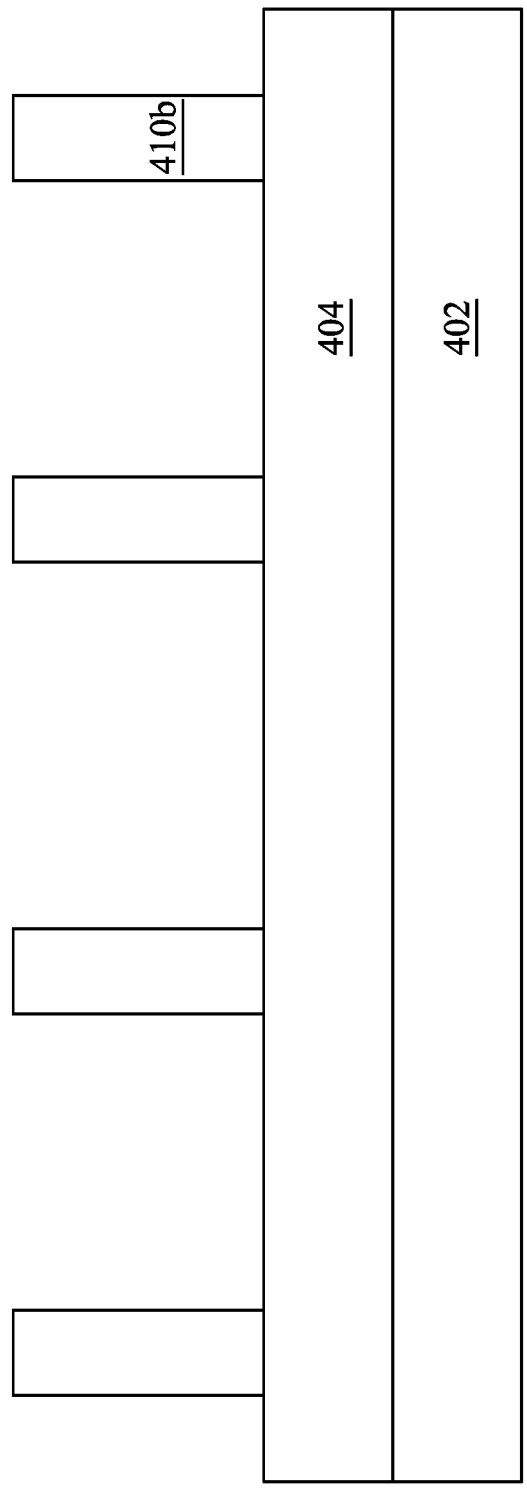

Referring now to FIG. 3 and FIG. 4F, the method 300 continues to operation 312 with selectively etching the first portion of the spacer layer 410a by using a wet etching process 411. In accordance with various illustrative embodiments, the wet etching process may include applying tetramethylammonium hydroxide (TMAH) over the substrate. As identified above, since the first portion of the spacer layer 410a includes a different porosity than the second portion of the spacer layer 410b, the first portion of the spacer 410a may be more "vulnerable" to TMAH. As such, the TMAH may penetrate through the first portion 410a, as illustrated in FIG. 4F, and then further selectively etch the patterned photoresist layer 406 as illustrated in FIG. 4G. After applying the TMAH, the second portion of the spacer layer 410b remains intact as illustrated in FIG. 4G. In an alternative embodiment, the selectively etching of the first portion 410a may include a dry etching process such as a reactive ion etching (RIE) process such that only the first portion 410a is etched and the second portion 410b remains intact during/after the dry etching process. In such an alternative example, after the first portion of the spacer layer 410a is removed, TMAH may be further applied so as to remove the patterned photoresist layer 406.

Figure 4H:
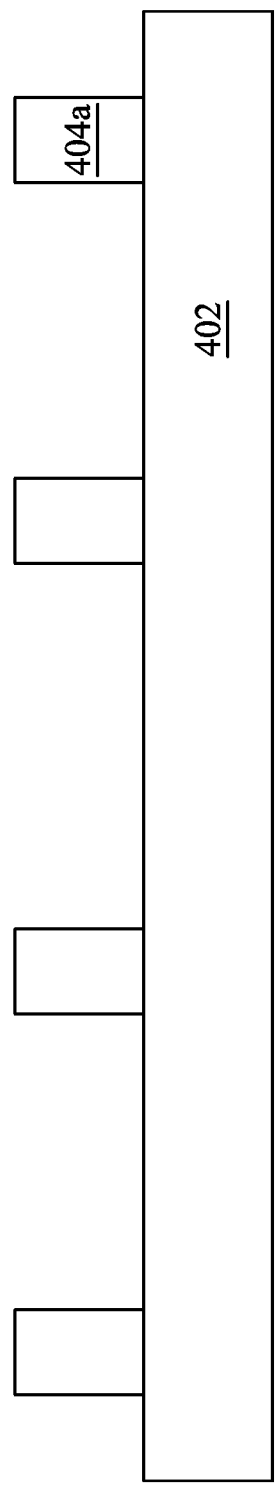

Referring now to FIG. 3 and FIG. 4H, the method 300 proceeds to operation 314 with forming a pattern 404a of the layer 404 by using the second portion of the spacer layer 410b as a mask. The formation of the pattern 404a may include at least one process such as a dry etching process. In the example of the layer 404 is a semiconductor layer (a silicon germanium layer) over the substrate 402, the pattern 404a of the silicon germanium layer may be designed as a fin structure of a subsequently formed FinFET (Fin Field Effect Transistor) structure. Alternatively, the formed pattern 404a may be subsequently used as another mask to transfer the pattern 404a to the substrate 402 by using at least one etching process.

Figure 5A:
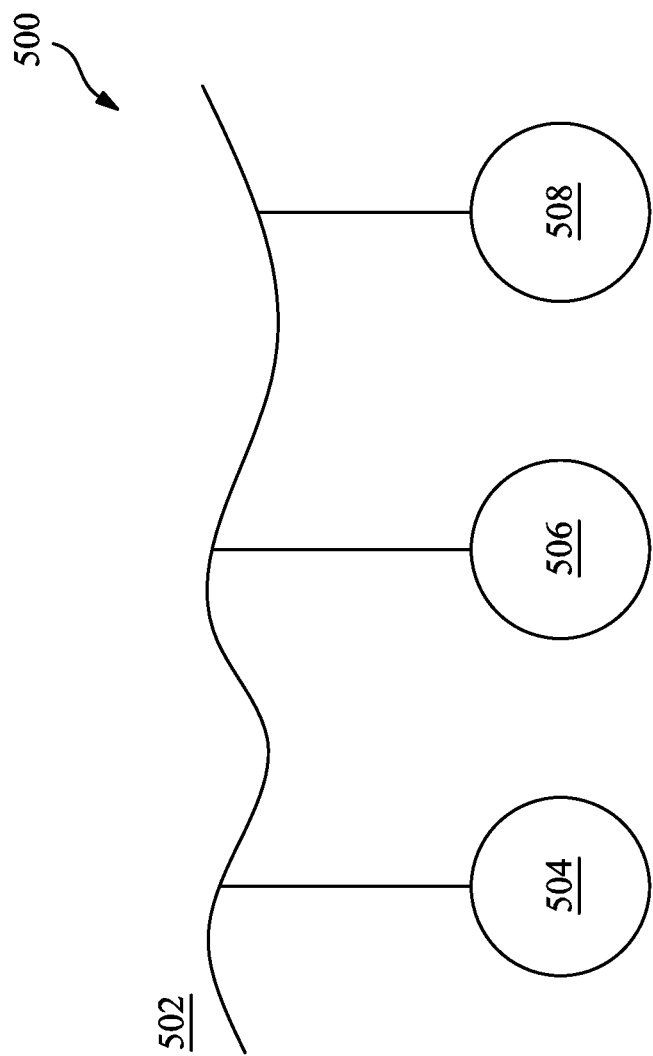
FIGS. 5A and 5B each illustrates an exemplary chemical structure of a grafting agent in accordance with some embodiments of the present disclosure.

FIG. 5a shows an example of the grafting agent 500 included in the grafting solutions 308 and 408. In some embodiments, the grafting agent 500 includes a polymer backbone 502, and the polymer backbone 502 is coupled (side-chained) with components 504, 506, and 508. More specifically, the polymer backbone 502 may include acrylate resin, methacrylate resin, and/or polyhydroxystyrene (PHS) resin; component 504 includes aromatic carbon ring, straight alkyl, cyclic alkyl, —OH, —NH2, RNH, —RHR', —ROOR—, —C═O, and/or R—O—R; component 506 includes aromatic carbon ring, straight alkyl, cyclic alkyl, alkoxyl, fluoroalkyl, fluoroalkoxyl, alkene, alkyne, hydroxyl, ketone, aldehyde, carbonate, carboxylic acid, ester, ether, amide, amine, imine, imide, azide, nitrate, nitrile, nitrite, and/or thiol functional group with about 5 to about 18 carbon side chains; and component 508 includes silicon-based polymer such as, for example, SiR and/or SiOR, whereby R may include oxygen, hydrogen, alkoxyl, nitrogen, alkyl, alkene, alkyne, hydroxyl, ester, ether, amide, and/or amine. Yet in some specific embodiments, molecular weight ratios of the component 504, component 506, and component 508 in the grafting agent may range between about 5% to 60%, about 30% to about 80%, and about 30% to about 80% respectively.

Figure 5B:
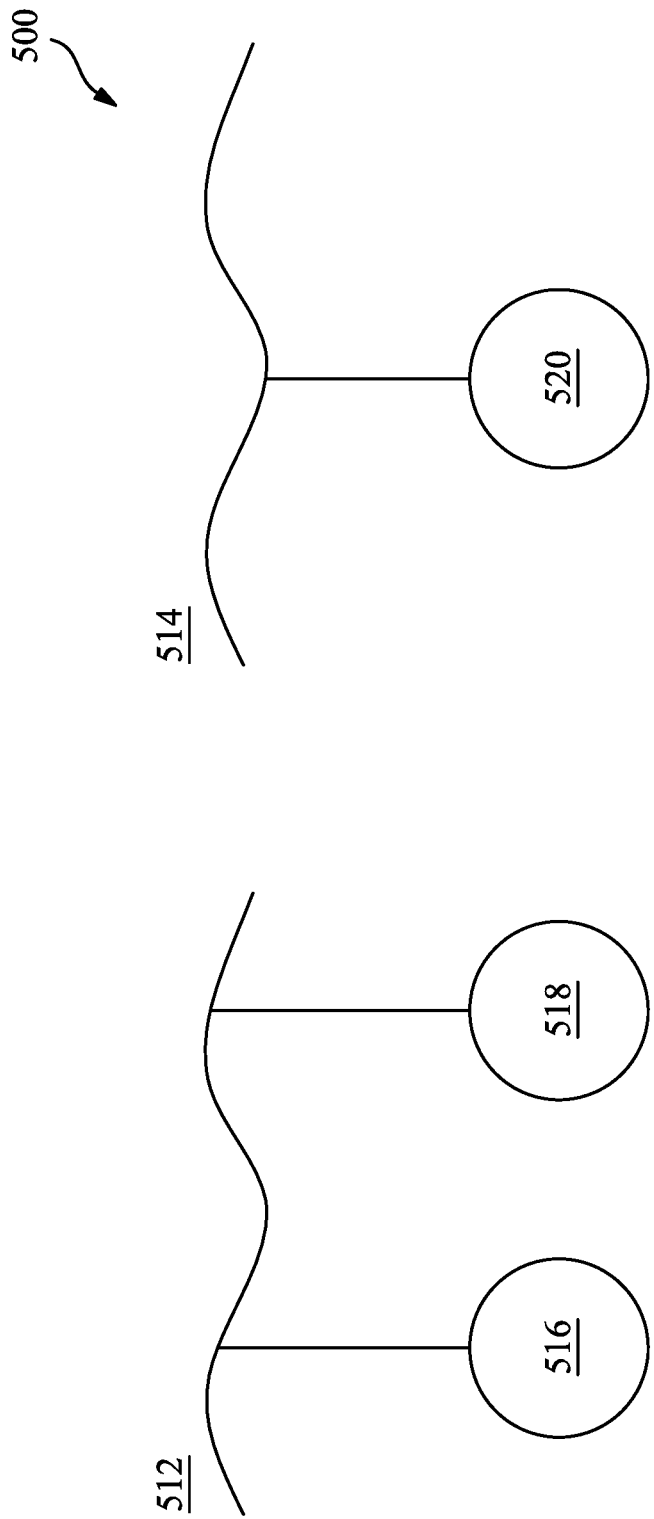

FIG. 5b shows another example of the grafting agent 500 included in the grafting solutions 308 and 408. In some embodiments, the grafting agent 500 includes a first polymer backbone 512, a second polymer backbone 514, the first polymer backbone 512 is coupled (side-chained) with components 516 and 518, and the second polymer backbone 514 is coupled (side-chained) with component 520. More specifically, the polymer backbones 512 and 514 may each include acrylate resin, methacrylate resin, and/or polyhydroxystyrene (PHS) resin; component 516 includes aromatic carbon ring, straight alkyl, cyclic alkyl, —OH, —NH2, RNH, —RHR', —ROOR', —C═O, and/or R—O—R; component 518 includes aromatic carbon ring, straight alkyl, cyclic alkyl, alkoxyl, fluoroalkyl, fluoroalkoxyl, alkene, alkyne, hydroxyl, ketone, aldehyde, carbonate, carboxylic acid, ester, ether, amide, amine, imine, imide, azide, nitrate, nitrile, nitrite, and/or thiol functional group with about 5 to about 18 carbon side chains; and component 520 includes silicon-based polymer such as, for example, SiR and/or SiOR, whereby R may include oxygen, hydrogen, alkoxyl, nitrogen, alkyl, alkene, alkyne, hydroxyl, ester, ether, amide, and/or amine. Yet in some specific embodiments, molecular weight ratios of the component 516, component 518, and component 520 in the grafting agent may range between about 5% to about 60%, about 30% to about 80%, and about 30% to about 80% respectively.

The present embodiments provide a variety of advantages to form a spacer layer over a substrate or a patterned device feature. In an example, by using, the disclosed grafting solution, a spacer layer may be formed without any baking step or with a relatively lower baking temperature compared to conventional approaches to form a spacer layer. As such, a variety of issues due to the high-temperature baking in conventional approaches to form a spacer may be advantageously avoided (e.g., contamination/degradation of a coupled organic polymer layer). In another example, in conventional spacer forming approaches, at least one sacrificial layer may be needed during the spacer forming process. In contrast, the current embodiment provides methods forming a spacer layer over a photoresist layer only by applying a fluid-based solution that includes a grafting agent over the photoresist layer. As such, using the fluid-based solution may thus advantageously circumvent the need to form the above-identified sacrificial layer given the fact that the spacer layer is formed over the photoresist layer only.

The present disclosure provides various embodiments of a method to provide the above-mentioned advantages. In an embodiment, the method includes forming a first layer over a substrate; forming a patterned photoresist layer over the first layer; applying, a solution over the patterned photoresist layer to form a conformal layer only over the pattern photoresist layer, wherein the conformal layer further includes a first portion over a top surface of the patterned photoresist layer and second portion extending along sidewalls of the patterned photoresist layer; selectively removing the first portion of the conformal layer formed over the top surface of the patterned photoresist layer; and selectively removing the patterned photoresist layer thereby leaving the second portion of the conformal layer.

In another embodiment, the method includes forming a first layer over a substrate; forming a patterned photoresist layer over the first layer, wherein the pattered photoresist layer includes a top surface and sidewalls; applying a solution over the patterned photoresist layer and the first layer; forming a heterogeneous layer only over the pattern photoresist layer, wherein the heterogeneous layer includes a first portion that is formed over the top surface of the patterned photoresist layer and a second portion that extends along the sidewalls of the patterned photoresist layer; and etching the first portion of the heterogeneous layer and the patterned photoresist layer such that the second portion of the heterogeneous layer remains intact after the etching of the first portion of the heterogeneous layer and the patterned photoresist layer.

Yet in another embodiment, the method includes forming a first layer over a substrate; forming a patterned photoresist layer over the first layer; forming a spacer layer only over the pattern photoresist layer by applying a grafting agent over the patterned photoresist layer, wherein the spacer layer includes a first portion formed over a top surface of the patterned photoresist layer and a second portion that extends along sidewalls of the patterned photoresist layer; selectively removing the patterned photoresist layer by using tetramethylammonium hydroxide (TMAH) thereby leaving the second portion of the spacer layer; and patterning the first layer by using the second portion of the spacer layer as a mask.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
forming a first layer over a substrate;
forming a patterned photoresist layer over the first layer, wherein the photoresist includes a floating additive that has an uneven distribution within the photoresist layer;
applying a solution over the patterned photoresist layer to form a conformal layer over the pattern photoresist layer, wherein the conformal layer further includes a first portion over a top surface of the patterned photoresist layer and second portion extending along sidewalls of the patterned photoresist layer;
selectively removing the first portion of the conformal layer formed over the top surface of the patterned photoresist layer; and
selectively removing the patterned photoresist layer thereby leaving the second portion of the conformal layer.

2. The method of claim 1, further comprising patterning the first layer by using the second portion of the conformal layer as a mask.

3. The method of claim 1, wherein the forming the conformal layer over the pattern photoresist layer includes baking the substrate and then rinsing the substrate with solvent, wherein the solvent may include nBA, MAK, PGMEA, PGEM, and/or a combination thereof.

4. The method of claim 1, wherein the patterned photoresist layer includes a negative tone developer photoresist.

5. The method of claim 4, wherein the selectively removing the patterned photoresist layer includes either applying tetramethylammonium hydroxide (TMAH) over the substrate or applying a dry etching process.

6. The method of claim 1, wherein the solution includes a grafting agent that includes a polymer backbone that is coupled with a first component, a second component, and a third component,
wherein the first component includes a component selected from the group consisting of an aromatic carbon ring, straight alkyl, cyclic alkyl, —OH, —NH2, RNH, —RHR', —ROOR', —C═O, and R—O—R, wherein R is either a carbon atom or a silicon atom;
wherein the second component includes a component selected from the group consisting of an aromatic carbon ring, straight alkyl, cyclic alkyl, alkoxyl, fluoroalkyl, fluoroalkoxyl, alkene, alkyne, hydroxyl, ketone, aldehyde, carbonate, carboxylic acid, ester, ether, amide, amine, imine, imide, azide, nitrate, nitrile, nitrite, and/or thiol functional group with about 5 to about 18 carbon side chains, and wherein the third component includes a silicon-contained polymer.

7. The method of claim 1, wherein the solution includes a grafting agent that includes a first polymer backbone and a second polymer backbone,
wherein the first polymer backbone is coupled with a first component and a second component, wherein the first component is selected from the group consisting of an aromatic carbon ring, straight alkyl, cyclic alkyl, —OH, —NH2, RNH, —RHR', —ROOR', —C═O, and/or R—O—R, wherein R is either a carbon atom or a silicon atom, and wherein the second component is selected from the group consisting of an aromatic carbon ring, straight alkyl, cyclic alkyl, alkoxyl, fluoroalkyl, fluoroalkoxyl, alkene, alkyne, hydroxyl, ketone, aldehyde, carbonate, carboxylic acid, ester, ether, amide, amine, imine, imide, azide, nitrate, nitrile, nitrite, and/or thiol functional group with about 5 to about 18 carbon side chains.

8. The method of claim 7, wherein the second polymer backbone is coupled with a third component, and
wherein the third component includes a silicon-contained polymer.

9. The method of claim 1, wherein the floating additive includes fluorine and/or a fluorine derivative.

10. A method comprising:
forming a first layer over a substrate;
forming a patterned photoresist layer over the first layer, wherein the pattered photoresist layer includes a top surface and sidewalls, wherein the photoresist includes an additive that has a greater concentration at a top surface of the patterned photoresist layer than the sidewalls of the patterned photoresist layer;
applying a solution over the patterned photoresist layer and the first layer;
forming a heterogeneous layer over the pattern photoresist layer, wherein the heterogeneous layer includes a first portion that is formed over the top surface of the patterned photoresist layer and a second portion that extends along the sidewalls of the patterned photoresist layer; and
etching the first portion of the heterogeneous layer and the patterned photoresist layer such that the second portion of the heterogeneous layer remains intact after the etching of the first portion of the heterogeneous layer and the patterned photoresist layer.

11. The method of claim 10, further comprising patterning the first layer by using the second portion of the heterogeneous layer as a mask.

12. The method of claim 10, wherein forming the heterogeneous layer over the patterned photoresist layer includes baking the substrate and then rinsing the substrate with solvent, wherein the solvent may include nBA, MAK, PGMEA, PGEM, and/or a combination thereof.

13. The method of claim 10, wherein the solution includes a grafting agent that includes a polymer backbone that is coupled with a first component, a second component, and a third component,
wherein the first component is selected from the group consisting of an aromatic carbon ring, straight alkyl, cyclic alkyl, —OH, —NH2, RNH, —RHR', —ROOR', —C═O, and/or R—O—R, wherein R is either a carbon atom or a silicon atom;
wherein the second component is selected from the group consisting of an aromatic carbon ring, straight alkyl, cyclic alkyl, alkoxyl, fluoroalkyl, fluoroalkoxyl, alkene, alkyne, hydroxyl, ketone, aldehyde, carbonate, carboxylic acid, ester, ether, amide, amine, imine, imide, azide, nitrate, nitrite, nitrile, and/or thiol functional group with about 5 to about 18 carbon side chains, and
wherein the third component includes a silicon-contained polymer.

14. The method of claim 10, wherein the solution includes a grafting agent that includes a first polymer backbone and a second polymer backbone, wherein the first polymer backbone is coupled with a first component and a second component, wherein the first component is selected from the group consisting of an aromatic carbon ring, straight alkyl, cyclic alkyl, —OH, —NH2, RNH, —RHR', —ROOR', —C═O, and/or R—O—R, wherein R is either a carbon atom or a silicon atom, and wherein the second component is selected from the group consisting of an aromatic carbon ring, straight alkyl, cyclic alkyl, alkoxyl, fluoroalkyl, fluoroalkoxyl, alkene, alkyne, hydroxyl, ketone, aldehyde, carbonate, carboxylic acid, ester, ether, amide, amine, imine, imide, azide, nitrate, nitrile, nitrite, and/or thiol functional group with about 5 to about 18 carbon side chains.

15. The method of claim 14, wherein the second polymer backbone is coupled with a third component, and
wherein the third component includes a silicon-contained polymer.

16. The method of claim 10, wherein the first portion of the heterogeneous layer has a different porosity than the second portion of the heterogeneous layer.

17. The method of claim 10, wherein the patterned photoresist layer includes a negative tone developer photoresist and
wherein etching the first portion of the heterogeneous layer and the patterned photoresist includes applying tetramethylammonium hydroxide (TMAH).

18. A method comprising:
forming a first layer over a substrate;
forming a patterned photoresist layer over the first layer, wherein the photoresist includes a floating additive that has a higher concentration at a top of the photoresist layer than a bottom of the photoresist layer;
forming a spacer layer over the pattern photoresist layer by applying a grafting agent over the patterned photoresist layer, wherein the spacer layer includes a first portion formed over a top surface of the patterned photoresist layer and a second portion that extends along sidewalls of the patterned photoresist layer;
selectively removing the patterned photoresist layer by using tetramethylammonium hydroxide (TMAH) thereby leaving the second portion of the spacer layer; and
patterning the first layer by using the second portion of the spacer layer as a mask.

19. The method of claim 18, wherein selectively removing the patterned photoresist layer includes performing a dry etching process to remove the first portion of the spacer layer that is formed on the top surface of the patterned photoresist layer.

20. The method of claim 18, wherein the first portion of the spacer layer has a different porosity than the second portion of the spacer layer.

* * * * *